United States Patent
Hook et al.

(10) Patent No.: US 9,761,525 B1
(45) Date of Patent: Sep. 12, 2017

(54) MULTIPLE BACK GATE TRANSISTOR

(71) Applicant: GLOBALFOUNDRIES INC., Grand Cayman (KY)

(72) Inventors: Terence B. Hook, Jericho, VT (US); Richard A. Phelps, Colchester, VT (US); Anthony K. Stamper, Burlington, VT (US); Renata A. Camillo-Castillo, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/142,525

(22) Filed: Apr. 29, 2016

(51) Int. Cl.
| | |
|---|---|
| *H01L 29/76* | (2006.01) |
| *H01L 29/94* | (2006.01) |
| *H01L 23/528* | (2006.01) |
| *H01L 29/06* | (2006.01) |
| *H01L 23/522* | (2006.01) |
| *H01L 29/78* | (2006.01) |

(52) U.S. Cl.
CPC ...... *H01L 23/5283* (2013.01); *H01L 23/5226* (2013.01); *H01L 29/0649* (2013.01); *H01L 29/7831* (2013.01)

(58) Field of Classification Search
CPC .......... H01L 29/0649; H01L 29/0653; H01L 23/5226; H01L 29/7831; H01L 23/5228
USPC ........................................................ 257/401
See application file for complete search history.

(56) References Cited

U.S. PATENT DOCUMENTS

| | | | |
|---|---|---|---|
| 6,664,598 B1 | 12/2003 | Dennard et al. | |
| 2010/0230735 A1* | 9/2010 | Zhu | H01L 27/10805 257/301 |
| 2014/0035102 A1* | 2/2014 | Korec | H01L 27/082 257/566 |
| 2016/0111497 A1 | 4/2016 | Simin et al. | |

FOREIGN PATENT DOCUMENTS

EP   0299380   1/1989

OTHER PUBLICATIONS

Office Action in related DE application No. 10 2016 211 222.8, dated Jan. 26, 2017, 2 pages.
Hermany Office Action in related German Application No. 10 2016 211 222.8 dated Jun. 9, 2017, 5 pages. (Partial English translation herewith).

* cited by examiner

*Primary Examiner* — Theresa T Doan
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to multiple back gate transistor structures and methods of manufacture. The structure includes: a transistor formed over a semiconductor material and an underlying substrate; and multiple isolated contact regions under a body or channel of the transistor, structured to provide a local potential to the body of the transistor at different locations.

19 Claims, 5 Drawing Sheets

MULTIPLE BACK GATE TRANSISTOR

FIELD OF THE INVENTION

The present disclosure relates to semiconductor structures and, more particularly, to multiple back gate transistor structures and methods of manufacture.

BACKGROUND

Ultra-thin body and ultra-thin BOX (UTBB) SOI CMOS technology has been developed for analog applications. In particular, UTBB has a good potential for analog applications featuring high $I_d$, $Gm_{max}$ and $A_v$. These and other types of devices, though, suffer from operational drawbacks. For example, UTBB and other types of devices, e.g., FETs, can only apply a single bias to a single location of the body or channel of the device, thus limiting its functionality and key parameters. As this is the case, specific strictures need to be designed for specific applications, leading to higher design and manufacturing costs.

SUMMARY

In an aspect of the disclosure, a structure comprises: a transistor formed over a semiconductor material and an underlying substrate; and multiple isolated contact regions under a body of the transistor, structured to provide a local potential to the body or channel of the transistor at different locations.

In an aspect of the disclosure, a structure comprises: a transistor formed over a semiconductor material; and multiple backside conductive contacts under the transistor which provide different biases at different locations to a body of the transistor.

In an aspect of the disclosure, a structure comprises: a transistor provided on a wafer; a first backside conductive region under a first edge of the transistor; a second backside conductive region extending under a second edge of the transistor; one or more multiple backside conductive regions under a channel region of the transistor; and a voltage bias connecting to each of the first, second and one or more multiple backside conductive regions from a front side of the wafer, which provide different biases at different locations to a body of the transistor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to multiple back gate transistor structures and methods of manufacture. In embodiments, the multiple back gate transistor structures can be Ultra Thin Body and Box (UTBB) transistors which allow manipulation of the threshold voltage by modifying the potential of the region under a BOX (buried oxide) layer. More specifically, the present disclosure describes devices with portions of the transistor that can be independently manipulated by applying specific biases to specific locations (e.g., stripes in the width dimension or stripes in the length dimension). Advantageously, by such manipulation, key analog FET parameters such as drain-to-source breakdown voltage, gds and gm can be tuned and matched, as well as Vt. Furthermore, device variations in width can be tuned in detail, or perhaps more properly stated, tuned out. Moreover, asymmetric devices can be formed and also modulated dynamically.

In more specific embodiments, the structures described herein can include relatively long or wide transistors, in which one or more shallow trench isolation (STI) regions (junction) may be used to laterally isolate or separate backside contacts. For example, the STI junction can be approximately 100 nm at a minimum. The structures can be used in analog functions with a length of 100 nm-2000 nm as examples. The structures described herein can be wide or long devices useful in analog functions, as matching is improved. In any of these different variations, by providing contacts on the backside of the transistor (e.g., gate structure), it is now possible to provide different biases to the transistor and, hence, the capability of manipulating the device for different functionality as described further herein.

The multiple back gate transistor structures of the present disclosure can be manufactured in a number of ways using a number of different tools. In general, though, the methodologies and tools are used to form structures with dimensions in the micrometer and nanometer scale. The methodologies, i.e., technologies, employed to manufacture the multiple back gate transistor structures of the present disclosure have been adopted from integrated circuit (IC) technology. For example, the structures are built on wafers and are realized in films of material patterned by photolithographic processes on the top of a wafer. In particular, the fabrication of the multiple back gate transistor structures uses three basic building blocks: (i) deposition of thin films of material on a substrate, (ii) applying a patterned mask on top of the films by photolithographic imaging, and (iii) etching the films selectively to the mask.

Figure 1:
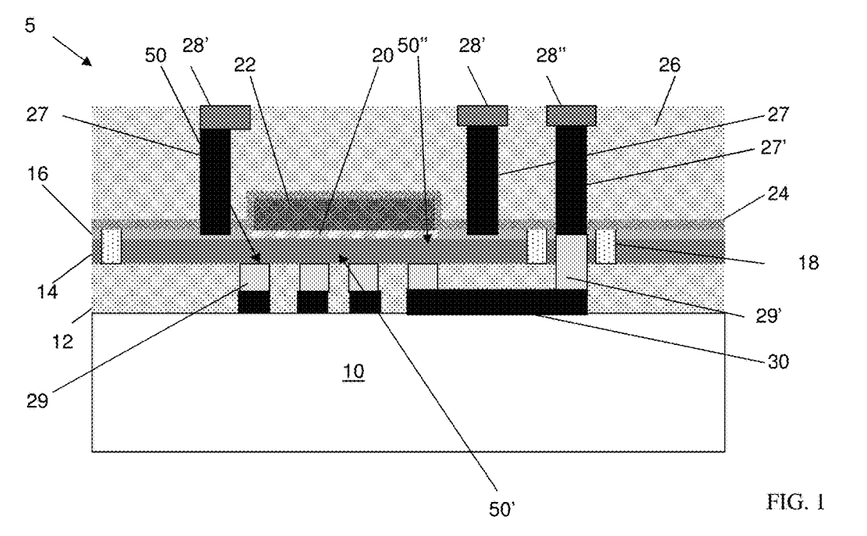
FIG. 1 shows a multiple back gate transistor structure and respective fabrication processes in accordance with aspects of the present disclosure.
Figure 4:
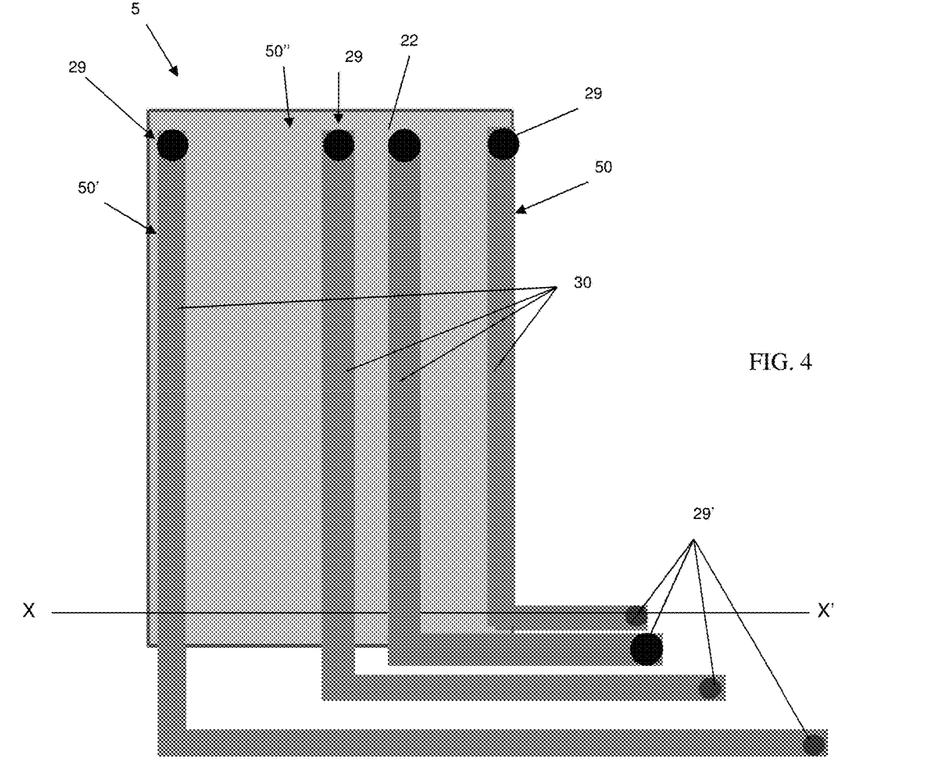
FIG. 4 shows a top view of the multiple back gate transistor structure in accordance with aspects of the present disclosure.

FIG. 1 shows a multiple back gate transistor structure and respective fabrication processes in accordance with aspects of the present disclosure through a cross sectional view along line X-X' shown in FIG. 4. More specifically, as shown in FIG. 1, the multiple back gate transistor structure 5 includes an insulator layer 12 formed on a substrate 10. In embodiments, the substrate 10 can be, for example, a glass substrate or a high resistive silicon (Si) wafer. The insulator layer 12 can be an oxide layer. A semiconductor material 14 is formed on the insulator layer 12. In embodiments, the semiconductor material 14 can be composed of any suitable material including, but not limited to, Si, SiGe, SiGeC, SiC, GE alloys, GaAs, InAs, InP, and other III/V or II/VI compound semiconductors. The semiconductor material 14 can be formed to a thickness of about 10 nm to about 4000 nm and, more preferably, from about 30 nm to 100 nm; although other thicknesses are contemplated herein.

In embodiments, the semiconductor material 14 may be a thin silicon layer on a silicon-on-insulator (SOI), and the insulating layer 12 may be a buried oxide (BOX) on the SOI wafer. Substrate 10 may have been bonded to the underside of the BOX layer 12 after the original handle wafer on the SOI wafer was removed.

A silicide layer 16 is formed on the exposed semiconductor layer 14. In embodiments, the silicide layer 16 can be, for example, cobalt, titanium, nickel, platinum, or tungsten silicide as known in the art. The silicide layer 16 can be formed by conventional self-aligned silicide (salacide) processes. By way of non-limiting illustrative example, the silicide process begins with deposition of a thin transition metal layer, e.g., cobalt, titanium, nickel, platinum, or tungsten. After deposition of the material, the structure is heated allowing the transition metal to react with exposed silicon (or other semiconductor material as described herein) in the active regions of the semiconductor device (e.g., source, drain, gate contact region), amongst other areas, forming a low-resistance transition metal silicide. Following the reaction, any remaining transition metal is removed by chemical etching, leaving silicide in the active regions of the device.

Still referring to FIG. 1, shallow trench isolation (STI) structures 18 can be formed in the semiconductor material 14, i.e., extending through the silicon layer 14 with no silicide formed on the surface. In embodiments, the STI structures 18 can be formed by conventional lithography, etching, deposition, and planarization processes as known in the art. More specifically, a resist formed over the silicide layer 16 can be exposed to energy (e.g., light) to form one or more openings (e.g., patterns). An etching process, e.g., reactive ion etching (RIE), can be performed through the openings, with a chemistry selective to the semiconductor material 14 and the silicide layer 16. The etching process will form openings in the semiconductor material 14. The resist is then removed using conventional stripants, e.g., oxygen ashing, followed by a deposition of insulator material within the openings. The deposition process can be a conventional chemical vapor deposition (CVD) process, using an oxide material. Any remaining oxide material on the surface of the silicide layer 16 can be removed using a conventional chemical mechanical polishing (CMP) process. In this way, lateral isolations regions can be formed.

Still referring to FIG. 1, a gate dielectric material 20 is formed on the semiconductor layer 14, after a patterning of the silicon layer 14. In embodiments, the gate dielectric material 20 can be deposited using any conventional deposition processes such as, e.g., thermal oxidization of the silicon, CVD of a low-k or high-k dielectric material, etc., depending on the desired performance characteristics of the device. The high-k dielectric material can be, for example, $HfO_2$; although other materials are contemplated herein.

FIG. 1 further shows the formation of the gate structure 22, e.g., FET gate structure. In embodiments, the gate structure 22 can be a poly gate structure or a metal gate structure formed using gate first or gate last processes. In embodiments, the gate structure 22 can be formed using conventional deposition, lithography and etching processes, in either of the gate first or gate last processes. In any scenario, the gate structure 22 is formed over the gate dielectric material 20.

The gate structure 22 can include sidewall structures, spacers, contacts, etc, all formed using conventional processes such that no further explanation is required herein for an understanding of the present structure. Also, in embodiments, the semiconductor layer 14 can be doped or ion implanted in a conventional manner, e.g., using arsenic, antimony, boron, phosphorous, or other dopants as known in the art, to form source and drain regions for the gate structure 22. For example, arsenic can be used for n-type semiconductors and boron can be used for p-type semiconductors.

Still referring to FIG. 1, an optional silicon nitride layer 24 is deposited over the gate structure 22 and the silicide layer 16. In embodiments, the silicon nitride layer 24 can be deposited using conventional CVD processes. The silicon nitride layer 24 can be deposited to a thickness of about 25 nm to about 75 nm; although other dimensions are contemplated by the present disclosure. In embodiments, the silicon nitride layer 24 acts as a mobile ion barrier. Moreover, in embodiments, the silicon nitride layer 24 acts as an etch stop or marker layer for subsequent contact 27 formation. An interlevel dielectric layer 26 is deposited and planarized over the silicon nitride layer 24. In embodiments, the interlevel dielectric layer 26 can be an oxide or low-k dielectric material formed using conventional deposition processes, e.g., CVD processes, as known in the art.

Contacts 27, 27' and metal wiring 28', 28" are formed in the interlevel dielectric layer 26. For example, contacts 27 and wires 28' can be formed in direct contact with the source and drain regions of the gate structure 22, using conventional lithography, etching processes deposition, and planarization processes. The contacts 27, 27' and metal wiring 28', 28" can be formed by conventional single or dual damascene processes, resulting in contacts 27, 27' and upper wiring layers 28', 28". In embodiments, the contacts 27, 27' and wires 28', 28" can be any conductive material such as, e.g., copper, aluminum, tungsten etc. A CMP process can be performed to remove any residual metal from the interlevel dielectric layer 26, after the deposition process. Alternatively, the contacts 27, 27' could be formed using a first single damascene process and the wires 28', 28" subsequently formed using a single damascene process or second subtractive etch process, as is known in the art.

In addition, contacts 29, 29' as well as wires 30 can be formed through the backside of the device, extending to or through the insulator layer 12. The contacts 29, 29' and metal wires 30 are formed by conventional single or dual damascene or subtractive etch lithography, etching processes and deposition processes. For example, the contacts 29, 29' and wires 30 can be formed by conventional dual damascene processes, or any method known in the art, such as single damascene or subtractive etch.

As further shown in FIG. 1, one or more backside contacts 29, 29' and wires 30 are formed in the insulator layer 12, e.g., BOX layer, under the gate structure 22. In embodiments, the one or more backside contacts 29, 29' and wires 30 are isolated regions separated laterally by the insulating material 12. The one or more backside contacts 29 are located under the gate structure 22, in addition to under the opposing edges of the gate structure 22 (e.g., source and drain regions 50, 50" of the gate structure 22). The one or more backside contacts 29 and wires 30 can be wired to different voltage sources as shown representatively by contact 27', wire 28", and contact 29'. Contact 29' is in electrical contact with contact 27', wire 28", and also is electrically connected to one of the contacts 29 under the FET. All of the contacts 29 under the FET can be wired to the wafer front side to have a predetermined voltage applied to them.

By having the FET channel and body backside contacts wired to different voltage sources, it is now possible to have separate voltage controls, e.g., separate biases or potentials, from a backside of the device, hence providing the capability of manipulating the characteristics of the gate structure 22, e.g., transistor. More specifically, the one or more contacts 29 under gate structure 22 (e.g., in the channel region 50' (e.g., center) of the gate structure 22) can be biased to reduce the on-resistance of the transistor; whereas, the one or more backside contacts 29 under the edges (source and drain regions 50, 50") of the transistor can be biased to improve the breakdown voltage at the edge of the gate structure 22.

For example, the channel edge region 50, 50" could be biased to increase the source to drain breakdown voltage while the channel region 50' away from the channel edge region 50, 50" could be biased to decrease the channel resistance. This would result in a NFET switch, for example, with both improved breakdown voltage and lower on resistance. For example, by applying a different voltage to the backgate (only) at the source, e.g., region 50), it is possible to improve the gds of the device making the device asymmetric. It is also possible to provide forward-biasing by applying a voltage at the drain end, e.g., at reference numeral 50". Moreover, by dynamically applying a voltage to one or more of the backside contacts, as desired, it is possible to provide a dynamic asymmetry (e.g., if the device is a passgate). Also, for a high-Vt device, it is now possible to apply a backgate voltage to only the center portion of the channel as shown representatively at reference numeral 50', thereby raising the Vt without increasing the drain field and hence minimizing the impact on BTB. Additionally, by applying different backgate voltages on the edges 50, 50" of a wide device, it is possible to eliminate variations in Vt from wider and narrower devices thus providing a tuned narrow-channel effect.

In embodiments, simulations have been conducted with structures described herein, e.g., a device with a backgate with a 0.01 um BOX thickness. In the simulations, it was found that with a 0.75V shift in backgate voltage, a 100 mV shift in Vt can be obtained. The following are a set of voltage conditions which should scale linearly with the BOX thickness:

Vg bias=1.5V;
Vds bias=0.05V (linear region);
LR Edge of channel voltage bias −0.25V; and
Center of channel voltage bias 0.5V.

These voltage conditions would tend to "shut off" the outer edge of the device which may, in general, have a lower Vt than the rest of the device.

In embodiments, the backside contacts 29, 29' and wires 30 can be any conductive metal such as, for example, copper, tungsten, aluminum, doped poly, etc., provided at particular intervals. The conductivity of the backside contacts 29, 29' and wires 30 is less important than that of the frontside contacts 27, 27' wires 28, 28" since no or low current is passed through these contacts 29, 29' and wires 30. For example, the one or more backside contacts 29 can be spaced equidistance along the width dimension of the gate structure 22, separated by insulator material of the insulator layer 12. Alternatively, the one or more backside contacts 29 can be spaced along the length dimension of the gate structure 22, separated by insulator material of the insulator layer 12. In further exemplary embodiments, the one or more backside contacts 29 can be about 20-30 nm wide, and separated by a distance of about 20-30 nm; although other dimensions are contemplated herein depending on the particular technology node of the gate structure 22. For example, the STI junctions could be approximately 100 nm, with the devices used in analog functions being approximately 30 nm to 2000 nm in length.

As shown in the embodiment of FIG. 1, the backside contacts 29, 29' are formed entirely through the insulator layer 12, contacting the backside of the semiconductor material 14 under the gate structure 22; although other configurations are also contemplated as described herein. In embodiments, the contacts 29 are in direct electrical and physical contact with the wiring to control voltage biases thereto, e.g., wiring 28".

The backside contacts 29, 29' can be formed by conventional lithography, etching and deposition methods. For example, after removing the SOI handle wafer and prior to bonding/forming/attaching the permanent substrate 10 to the insulator layer 12, when the insulator layer 12 is exposed, a resist can be formed on the insulator layer 12. As already described herein, the resist can be exposed to energy (e.g., light) to form one or more openings (e.g., patterns). An etching process, e.g., reactive ion etching (RIE), can be performed through the openings, with a chemistry selective to the insulator layer 12. The etching process will form openings in the insulator layer 12, which are filled with a metal material after the resist is stripped using conventional stripants, e.g., oxygen ashing. The deposition process can be a CVD process. Any remaining metal material on the surface of the insulator layer 12 can be removed using a conventional CMP process. Once the backside contacts are completed, the substrate 10 can be attached to the insulator layer 12.

Figure 2:
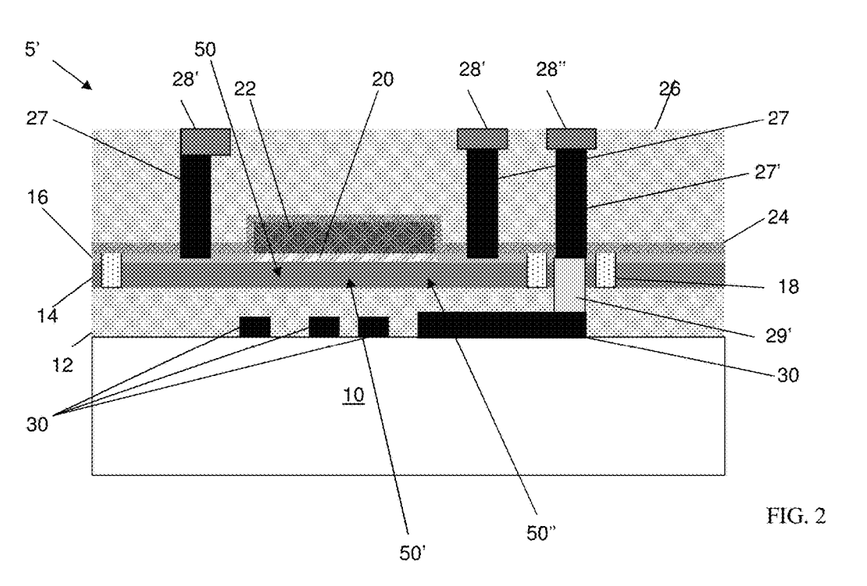
FIG. 2 shows a multiple back gate transistor structure and respective fabrication processes in accordance with additional aspects of the present disclosure.

FIG. 2 shows a multiple back gate transistor structure and respective fabrication processes in accordance with additional aspects of the present disclosure. In this embodiment, the multiple back gate transistor structure 5' includes one or more backside contacts 29' and wires 30 formed in the insulator layer 12. As described above, the one or more backside contacts 29' and wires 30 are isolated regions separated laterally by insulating material 12. In this embodiment, though, the one or more backside wires 30 do not have contacts to reach or contact the semiconductor material 14 under the FET channel. In other words, the one or more backside wires 30 are only partially formed through the insulator layer 12, leaving a space between an end of the wires 30 and the semiconductor material 14.

The one or more backside wires 30 can be formed in substantially the same manner as noted above in substantially the same locations, e.g., at the edges 50, 50" (e.g., source and drain regions) and channel region 50' (e.g., center) of the gate structure 22, using conventional lithography, etching and deposition methods; however, the etching process will be timed to form trenches only partially through a thickness of the insulator layer 12. As shown in FIG. 2, one or more contacts 29' can electrically connect the wires 30 under the FET channel to a voltage source on the wafer front side using contact 29', contact 27', and wire 28" in a fashion similar to what was described in FIG. 1.

Figure 3:
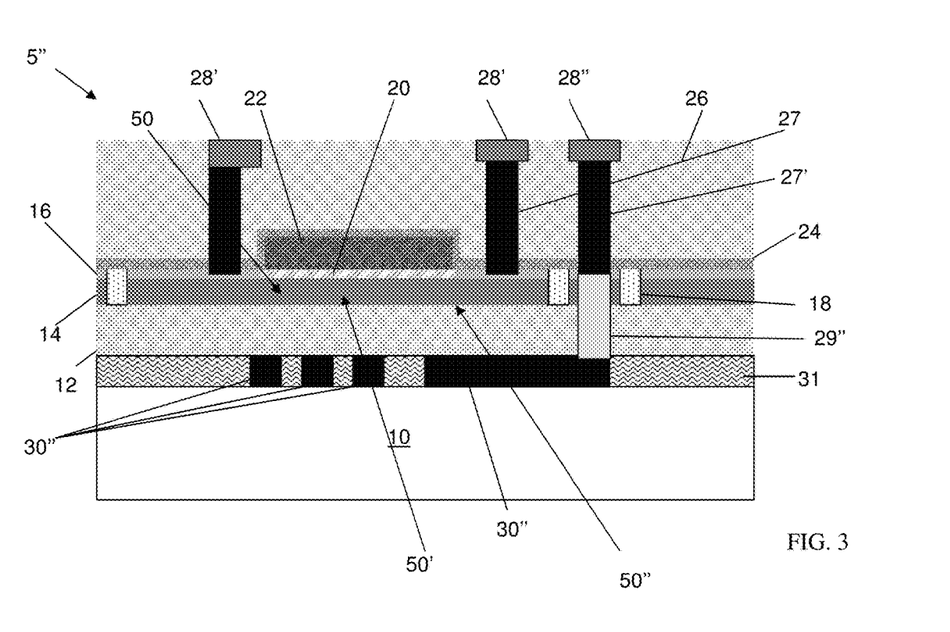
FIG. 3 shows a multiple back gate transistor structure and respective fabrication processes in accordance with yet additional aspects of the present disclosure.

FIG. 3 shows a multiple back gate transistor structure and respective fabrication processes in accordance with yet additional aspects of the present disclosure. In this embodiment, the multiple back gate transistor structure 5" includes one or more backside contacts 29" formed completely through the insulator layer 12 and wires 30" formed under the insulator layer 12. An adhesive layer 31 is used to bond the underlying substrate 10 to the insulator layer 12. As described above, the one or more backside wires 30" are isolated regions but now separated laterally by the adhesive layer 31.

In the embodiment of FIG. 3, the one or more backside wires 30" do not reach or contact the semiconductor material 14. In other words, the one or more backside wires 30" are contacting an underside of the insulator layer 12, leaving a space between the top surface of the wires 30 and the bottom surface of semiconductor material 14. In embodiments, the space can be a thickness of the insulator layer 12. As with the other embodiments, contact 29" is used to connect the one or more wires 30 to voltage bias on the wafer front side.

The one or more backside contacts 29" and wires 30" can be formed in substantially the same manner as noted above, e.g., by conventional lithography, etching and deposition methods through and on a surface of the insulator layer 14; however, in addition, the one or more backside wires 30" will be encapsulated within the adhesive layer 31 during a bonding reflow process used to bond the insulator layer 12 to the semiconductor layer 14. In this embodiment, as with others described herein, the one or more backside wires 30" are in substantially the same locations, e.g., at the edges 50, 50" (e.g., source and drain regions) and channel region 50' (e.g., center) of the gate structure 22.

In additional embodiments, any combination of the embodiments shown in FIGS. 1-3 can be combined to form backside contacts and wires. For example, it is contemplated herein that the contacts can be formed: (i) partially within the insulator layer 12 and an entire thickness of the underlying substrate 10; (ii) partially within the insulator layer 12 and partially through a thickness of the underlying substrate 10 or adhesive layer material 31; and/or (iii) entirely within the insulator layer 12 and an entire thickness of the underlying substrate 10.

FIG. 4 shows a top view of the multiple back gate transistor structure in accordance with aspects of the present disclosure. As shown in FIG. 4, each of the one or more backside contacts 29 and/or wires 30 are provided under the gate structure 22. Note that backside contacts 29 are only included for the FIG. 1 embodiment and not for the embodiments of FIGS. 2 and 3. The one or more backside wires 30 are provided under a source region 50, drain region 50" and the channel 50' of the gate structure 22. The one or more backside contacts 29' and wires 30 can be connected to a wiring 27 (as shown in FIG. 1). The wiring 27 are connected to a voltage source in order to provide a particular voltage (bias) to a body of the gate structure, via each of the one or more backside contacts 29 and/or wires 30. Accordingly, in this way, the one or more backside contacts 29 and/or wires 30 can provide a bias to a particular location on a backside of the gate structure 22.

Figure 5A:
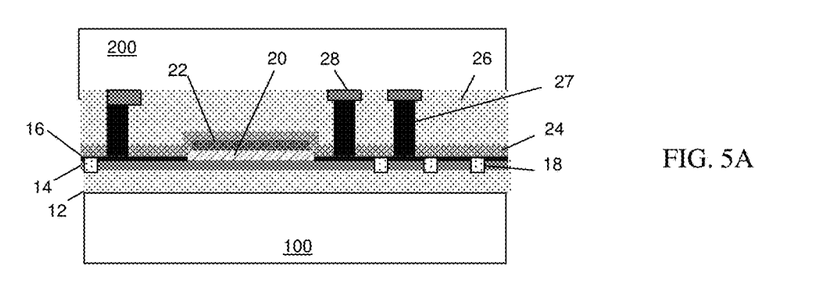
FIGS. 5A-5E show fabrication processes for building a multiple back gate transistor structure in accordance with aspects of the present disclosure.

FIGS. 5A-5E show fabrication processes for building a multiple back gate transistor structure which has the SOI handle wafer removed, wires and contacts formed in or on the BOX, and a glass or other handle wafer attached to the underside of the BOX in accordance with aspects of the present disclosure. As shown in FIG. 5A, a temporary wafer 200 is attached to any of the structures described in FIGS. 1-4, prior to the formation of the one or more backside contacts, using a temporary attachment bonding process, such as HD3007 polyimide. In embodiments, the temporary wafer 200 can be a glass wafer or a silicon handle wafer.

Figure 5B:
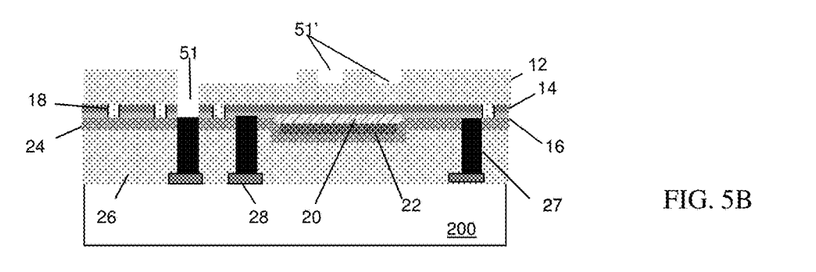

In FIG. 5B, the structure is flipped over and the handle wafer 100 is removed, exposing the insulator layer 12. In embodiments, the handle wafer 100 may be removed by a combination of backside grinding and etching, as known in the art. The insulator layer 12 is patterned using conventional lithography and etching processes, followed by deposition of material, as described above, to form contacts and wires as known in the art. In embodiments, a subtractive etch, damascene or dual damascene etching process is performed. In this way, a dual damascene opening 51, e.g., contact and trench structure, and one or more single damascene openings 51', can be formed in the insulator layer 12. Based on the etching rate, the contact can extend partially or completely through the insulator layer 12 as described herein. Note that the embodiment shown in FIG. 3 would use a single damascene process to form the contact 51 and subtractive etch process to form the wire 51' (not shown).

Figure 5C:
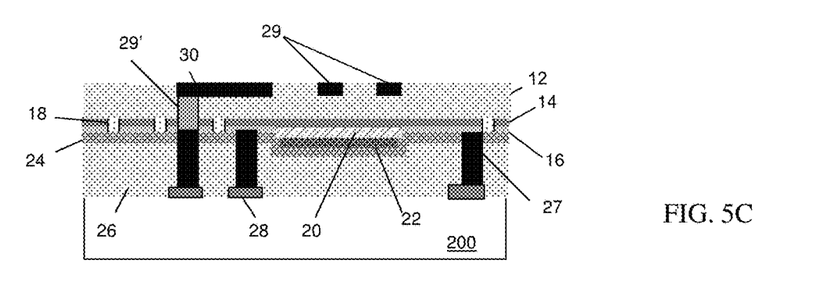

In FIG. 5C, metal material is formed within the damascene openings to form backside contacts 29 (not shown), 29' and wires 30. In embodiments, the metal material can be any conductive material as already described herein, e.g., copper, tungsten, aluminum, doped poly, etc. It should also be understood by those of ordinary skill in the art that more than one single backside contact 29, 29' and wire 30 can be formed, e.g., a plurality of such backside contacts and wires can be formed in the manner described herein. In embodiments, the conductive material can be formed by a conventional deposition process, e.g., CVD, followed by a cleaning process, e.g., CMP.

Figure 5D:
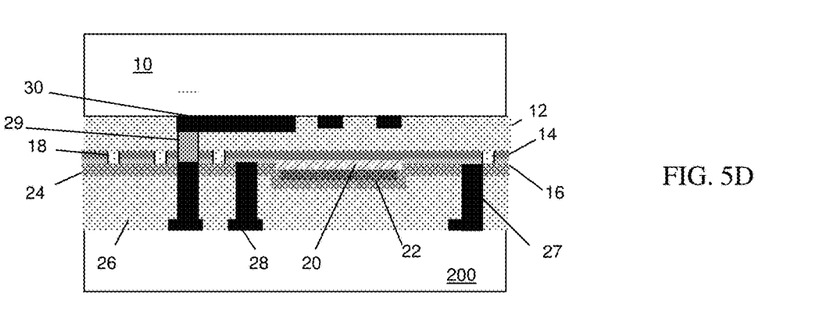

In FIG. 5D, a permanent wafer 10 can be bonded to the insulator layer 12. In embodiments, the permanent wafer 10 can be, for example, a glass wafer or a high resistance silicon wafer. The wafer 10 can be bonded using an oxide-oxide bond, adhesive bonding, eutectic metal bonding, or other known techniques. In additional or alternative embodiments, the wafer 10 can also undergo processing to form through silicon vias partially or entirely through the wafer 10, as already described herein.

Figure 5E:
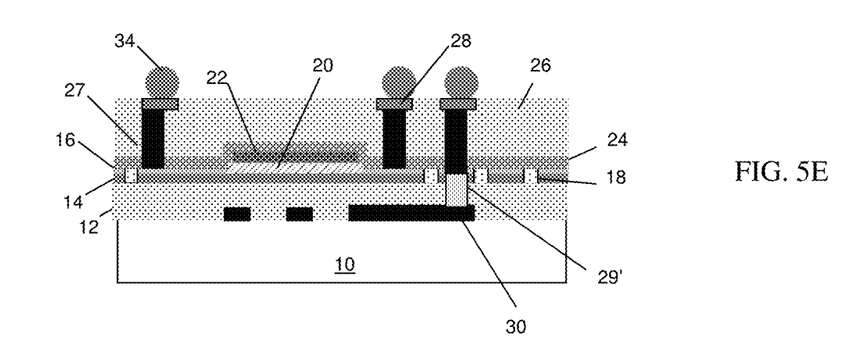

In FIG. 5E, the temporary wafer can be removed, exposing the contacts 27 and wires 28, e.g., source/drain contacts and other wirings. The exposed surface of the interlevel dielectric material 26 and contacts 27 and wires 28 can then undergo a cleaning process, if needed. Additional optional wiring, via, solder bumps, copper pillars, etc. levels (not shown) can be formed. These optional additional wiring, via, and packaging levels could have been formed prior to the wafer bonding and wafer backside processing, as known in the art.

In alternative embodiments, the temporary wafer 200 can be used as a permanent handle wafer with additional wiring layers formed above the insulator layer 12. Optional wiring land via layers can then be formed to the contacts, with solder 34 connections provided. In embodiments, the solder connections 34 can be, for example, C4 solder connections. The wafer can then undergo conventional dicing, with the individual chips being packaged.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a transistor formed over a semiconductor material and an underlying substrate; and
multiple isolated contact regions under a body of the transistor in at least a channel and under source and drain regions of the transistor, which are structured to provide a local potential to the body or the channel of the transistor at different locations,
wherein the isolated contact regions are conductive contacts in a wafer, separated from the transistor by the oxide layer and the semiconductor layer.

2. The structure of claim 1, wherein the isolated contact regions are separated laterally by insulating material.

3. The structure of claim 1, wherein the isolated contact regions are separated laterally by doping of an opposite type than that of the multiple isolated contact regions.

4. The structure of claim 1, wherein the local potential at the different locations are different potentials applied to different regions of the transistor.

5. The structure of claim 1, wherein the isolated contact regions are along a length of the transistor.

6. The structure of claim 1, wherein the isolated contact regions are along a width of the transistor.

7. The structure of claim 1, wherein the isolated contact regions are conductive contacts in an oxide layer, underlying the semiconductor material.

8. The structure of claim 7, wherein the conductive contacts extend entirely through the oxide layer, contacting the semiconductor material and wires formed under the oxide layer, with an adhesive layer bonding the underlying substrate to the oxide layer.

9. The structure of claim 7, wherein the conductive contacts extend partially through the oxide layer, leaving a space between an end of the conductive contacts and the semiconductor material.

10. The structure of claim 1, wherein the conductive contacts are formed partially through the wafer.

11. The structure of claim 1, wherein the conductive contacts are a first dopant type and the wafer is a second dopant type, opposite the first dopant type.

12. A structure, comprising:
a transistor; and
multiple backside conductive contacts under the transistor which provide different biases at different locations to a body of the transistor.

13. The structure of claim 12, wherein the multiple backside conductive contacts are separated laterally by insulating material.

14. The structure of claim 12, wherein the multiple backside conductive contacts are separated laterally by doping of an opposite type than that of the multiple backside contacts.

15. The structure of claim 12, wherein:
the multiple backside conductive contacts are along a length of the transistor or a width of the transistor located in a channel region and under source and drain regions of the transistor; and
the multiple backside conductive contacts are formed entirely through an insulator layer and contact a semiconductor layer in which portions of the transistor are formed directly thereon.

16. The structure of claim 12, wherein the multiple backside conductive contacts are in a buried oxide layer, directly contacting semiconductor material on which the transistor is formed.

17. The structure of claim 12, wherein the multiple backside conductive contacts are in a buried oxide layer, separated from a bottom surface of semiconductor material on which the transistor is formed.

18. The structure of claim 12, wherein the multiple backside conductive contacts are formed in a wafer, separated from semiconductor material by an insulating material.

19. A structure, comprising:
a transistor provided on a wafer;
a first backside conductive region under a first edge of the transistor;
a second backside conductive region extending under a second edge of the transistor;
one or more multiple backside conductive regions under a channel region of the transistor; and
a voltage bias connecting to each of the first, second and one or more multiple backside conductive regions from a front side of the wafer, which provide different biases at different locations to a body of the transistor.

* * * * *